(12) United States Patent
Sun et al.

(10) Patent No.: US 12,394,566 B2
(45) Date of Patent: Aug. 19, 2025

(54) SNAP FIT BRACKET FOR ELECTROLYTIC CAPACITORS

(71) Applicant: Sandisk Technologies, Inc., Milpitas, CA (US)

(72) Inventors: Shiqiang Sun, Shenzhen (CN); Ning Ye, San Jose, CA (US); Lihwa Fong, Irvine, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 237 days.

(21) Appl. No.: 18/361,072

(22) Filed: Jul. 28, 2023

(65) Prior Publication Data

US 2024/0412922 A1 Dec. 12, 2024

Related U.S. Application Data

(60) Provisional application No. 63/506,742, filed on Jun. 7, 2023.

(51) Int. Cl.
*H05K 1/18* (2006.01)
*H01G 2/06* (2006.01)

(52) U.S. Cl.
CPC ............. *H01G 2/06* (2013.01); *H05K 1/181* (2013.01); *H05K 2201/10015* (2013.01); *H05K 2201/10628* (2013.01)

(58) Field of Classification Search
CPC ......... H05K 1/181; H05K 2201/10015; H05K 2201/10628
See application file for complete search history.

(56) References Cited

U.S. PATENT DOCUMENTS

| 4,584,630 | A | 4/1986 | Rubin | |
|---|---|---|---|---|
| 6,305,972 | B1 * | 10/2001 | Isbell | H05K 3/301 |
| | | | | 361/767 |
| 7,791,901 | B2 * | 9/2010 | Sailor | H01G 2/04 |
| | | | | 361/810 |
| 11,357,114 | B2 | 6/2022 | Tadele et al. | |
| 11,444,394 | B2 * | 9/2022 | Stremersch | H01G 9/008 |
| 11,581,136 | B2 * | 2/2023 | Hadwan | H01G 2/106 |
| 11,856,700 | B2 * | 12/2023 | Ryu | H05K 1/182 |
| 2012/0081835 | A1 | 4/2012 | Shimizu et al. | |
| 2019/0006101 | A1 | 1/2019 | Matsumae et al. | |

* cited by examiner

*Primary Examiner* — Sherman Ng
(74) *Attorney, Agent, or Firm* — DENTONS Durham Jones Pinegar

(57) ABSTRACT

A snap fit bracket for a capacitor slideably couples the capacitor to an opening defined by a substrate. The snap fit bracket includes four sidewalls that form a perimeter. The perimeter defines an opening into which the capacitor is horizontally positioned. A first channel is provided on a first side of the snap fit bracket and a second channel is provided on a second side of the snap fit bracket. Each of the first channel and the second channel are slideably coupled to respective edges within the opening of the substrate. A snap fit fastener is included in one or both of the first channel and the second channel. A portion of the snap fit fastener is received into a notch that is provided within the opening of the substrate which secures the snap fit bracket to the substrate.

20 Claims, 3 Drawing Sheets

SNAP FIT BRACKET FOR ELECTROLYTIC CAPACITORS

CROSS-REFERENCE TO RELATED APPLICATIONS

The present application claims priority to U.S. Provisional Application 63/506,742 entitled "SNAP FIT BRACKET FOR ELECTROLYTIC CAPACITORS", filed Jun. 7, 2023, the entire disclosure of which is hereby incorporated by reference in its entirety.

BACKGROUND

Capacitors are typically included with various solid-state drives (SSDs) and/or enterprise solid-state drives (eSSDs). Capacitors store and discharge electrical energy and are used to provide backup power in case of unexpected power outages and/or system failures. Capacitors may also help reduce the likelihood of voltage spikes.

Given these benefits, it is desirable to include high-capacity capacitors with SSDs and other semiconductor packages. However, some high-capacity capacitors are typically coupled to a substrate of the SSD using laser soldering, which can be a time-intensive and/or a costly process.

In other examples, some high-capacity capacitors are surface mounted to the substrate. For example, a surface mount technology (SMT) grade capacitor may be placed into a bracket. The bracket is mounted to the substrate and a reflow soldering process secures the bracket to the substrate. Leads of the SMT grade capacitor may also be welded to one or more pads on the surface of the substrate. However, SMT grade capacitors are expensive.

Accordingly, it would be beneficial to surface mount high-capacity capacitors to a substrate without using a laser soldering process.

SUMMARY

The present application describes a bracket for an electrolytic capacitor. The bracket includes various features that enable the bracket to be slideably coupled to, and subsequently secured within, an opening defined by a substrate or a printed circuit board (PCB). In an example, the bracket and the electrolytic capacitor are secured within the opening defined by the substrate without using a reflow soldering process and/or a laser soldering process. In an example, the bracket and the electrolytic capacitor are positioned horizontally with respect to the opening defined by the substrate or PCB.

In an example, the bracket includes four different sidewalls that form a perimeter, or a body, of the bracket. The sidewalls of the bracket also define an opening that receives an electrolytic capacitor. A first channel is provided on a first side of the bracket and a second channel is provided on a second side of the bracket. Each of the first channel and the second channel enable the bracket to be slideably coupled to respective edges within the opening defined by the substrate. A fastener is included in one or more of the first channel and the second channel. At least a portion of the fastener in each of the first channel and/or the second channel is received into a notch positioned within the opening of the substrate, which secures the bracket to the substrate.

Accordingly, the present application describes a bracket for mounting a capacitor to a substrate. In an example, the bracket includes a first sidewall, a second sidewall opposite the first sidewall, a proximal wall extending between a proximal end of the first sidewall and a proximal end of the second sidewall and a distal wall extending between a distal end of the first sidewall and a distal end of the second sidewall. In an example, the first sidewall, the second sidewall, the proximal wall and the distal wall define an opening. A first flange and a second flange extend from the proximal wall to form a first channel that receives a first edge of a substrate. A third flange and a fourth flange extend from the distal wall to form a second channel that receives a second edge of the substrate. A first fastener is disposed within the first channel and a second fastener is disposed within the second channel.

A semiconductor package is also described. In an example, the semiconductor package includes a substrate that defines an opening. A notch is disposed on a first edge of the substrate within the opening. The semiconductor package also includes a bracket for a capacitor. The bracket is provided within the opening and includes a first sidewall, a second sidewall, a proximal wall extending between a proximal end of the first sidewall and a proximal end of the second sidewall and a distal wall extending between a distal end of the first sidewall and a distal end of the second sidewall. In an example, the first sidewall, the second sidewall, the proximal wall and the distal wall define a bracket opening. A first flange and a second flange extend from the proximal wall to form a first channel that is slideably coupled to the first edge of the substrate. A third flange and a fourth flange extend from the distal wall to form a second channel that is slideably coupled to a second edge of the substrate. A snap fit fastener is disposed within the first channel such that a portion of the snap fit fastener is received by the notch.

The present application also describes a bracket for mounting a capacitor to a substrate. In an example, the bracket includes a body that defines an opening. A first coupling means is provided on a proximal end of the body and a second coupling means provided on a distal end of the body. The first coupling means and the second coupling means enable the bracket to be slideably coupled to an opening defined by a substrate. A fastening means secures the bracket within the opening defined by the substrate.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1:
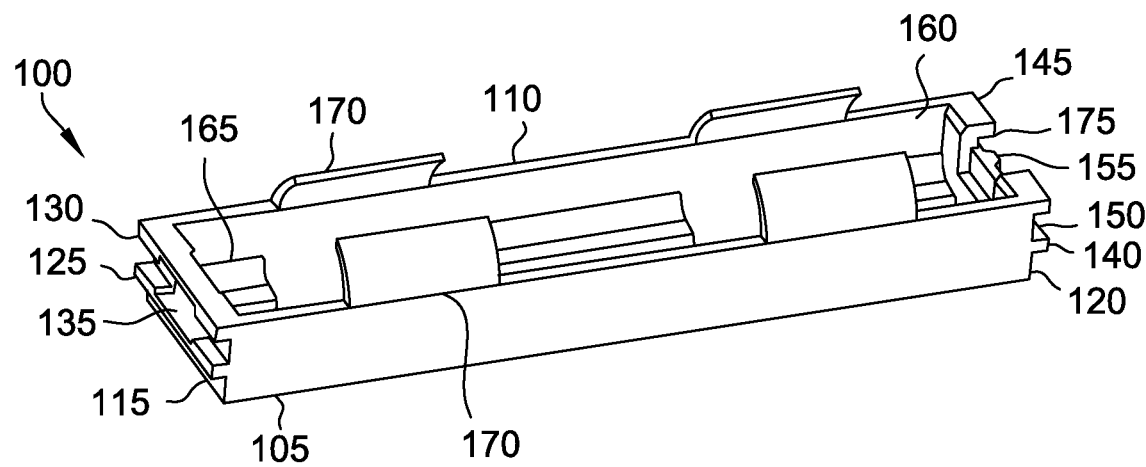
FIG. 1 illustrates a bracket for an electrolytic capacitor according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. The following detailed description is therefore not to be taken in a limiting sense, and the scope of the present disclosure is defined by the appended claims and their equivalents.

Capacitors, such as electrolytic capacitors (or e-caps), are typically included with various solid-state drives (SSDs) and/or enterprise solid-state drives (eSSDs). Capacitors store and discharge electrical energy and may be used to provide backup power in case of unexpected power outages and/or system failures. For example, a SSD constantly writes and reads data from memory cells. If there is a sudden loss of power, data that is being written or read may be lost or corrupted. However, using a capacitor, an SSD can maintain power long enough to complete any outstanding read and/or write operations.

Capacitors may also help reduce the likelihood of voltage spikes or other disturbances. As a result, a lifespan of the SSD may be prolonged. Give these benefits, it may be beneficial to include high-capacity, high-voltage capacitors, such as electrolytic capacitors, in various semiconductor packages.

However, some electrolytic capacitors, such as liquid electrolytic capacitors, may not be easily coupled to a substrate. For example, liquid electrolytic capacitors are typically coupled to a substrate using a laser soldering process. However, laser soldering is an expensive and time-consuming process.

In another example, an electrolytic capacitor may be mounted to a substrate using a reflow soldering process. In this example, the electrolytic capacitor is typically placed in a capacitor holder and the electrolytic capacitor is soldered to the capacitor holder. The capacitor holder, along with the electrolytic capacitor, is then soldered to the substrate using a reflow soldering process. However, this solution requires use of a surface mount technology (SMT) grade capacitor, which can be expensive. Additionally, two different soldering processes are needed to mount the electrolytic capacitor to the substrate.

In order to address the above, the present application describes a snap fit bracket for an electrolytic capacitor. Although an electrolytic capacitor is specifically described, the snap fit bracket may be used for any type of capacitor. In another example, the snap fit bracket described herein may be used for any number of computing components that are mounted to a substrate or a printed circuit board (PCB).

In an example, the snap fit bracket includes various features that enable the snap fit bracket to be slideably coupled to, and subsequently secured within, an opening defined by a substrate or a PCB. The snap fit bracket and the electrolytic capacitor may be secured within the opening defined by the substrate without using a reflow soldering process and/or a laser soldering process as is common in current mounting solutions.

In an example, the snap fit bracket includes four different sidewalls that form a perimeter. The sidewalls of the snap fit bracket also define an opening in which the electrolytic capacitor is received or positioned. A first channel is provided on a first side of the snap fit bracket and a second channel is provided on a second side of the snap fit bracket. Each of the first channel and the second channel enable the snap fit bracket to be slideably coupled to respective edges within the opening of the substrate. A snap fit fastener is included in one or both of the first channel and the second channel. At least a portion of the snap fit fastener is received into a notch that is provided on an edge of the substrate which secures the snap fit bracket within the opening of the substrate.

Once the snap fit bracket and the electrolytic capacitor have been secured within the opening, a hot bar soldering process (or other soldering process) may be used to electrically couple one or more leads of the electrolytic capacitor to one or more pads on a surface of the substrate.

Accordingly, many technical benefits may be realized including, but not limited to, increasing the speed and efficiency of mounting electrolytic capacitors to a substrate, replacing a costly laser soldering process with a less expensive hot bar soldering process, and reducing Z-height requirements by enabling the snap fit bracket to slide sideways into a substrate.

These and other examples will be explained in greater detail below with respect to FIG. 1-FIG. 4B.

FIG. 1 illustrates a bracket 100 for an electrolytic capacitor according to an example. The bracket 100 includes various features and/or mechanisms that are used to slideably couple and secure the bracket 100, and a capacitor positioned within the bracket 100, to a substrate. Although specific measurements of the bracket 100 are given below, the bracket 100 may be sized and/or shaped to fit any capacitor.

In an example, the bracket 100 includes a first sidewall 105 and a second sidewall 110 opposite the first sidewall 105. The first sidewall 105 and the second sidewall 110 may have a length of approximately forty-four millimeters (mm), although other lengths are contemplated. In addition, the first sidewall 105 and the second sidewall 110 may have a height of approximately four and a half mm, although other heights are contemplated.

The bracket 100 may also include a proximal wall 115 and a distal wall 120. The proximal wall 115 may extend between a proximal end of the first sidewall 105 and a proximal end of the second sidewall 110 Likewise, the distal wall 120 may extend between a distal end of the first sidewall 105 and a distal end of the second sidewall 110. In an example, the proximal wall 115 and the distal wall 120 may have a length of approximately ten mm although other lengths are contemplated.

The first sidewall 105, the second sidewall 110, the proximal wall 115 and the distal wall 120 may form a perimeter or a body of the bracket 100. Additionally, the first sidewall 105, the second sidewall 110, the proximal wall 115 and the distal wall 120 define an opening 160 that receives an electrolytic capacitor.

In an example, the opening 160 extends from a top surface of each of the first sidewall 105, the second sidewall 110, the proximal wall 115 and the distal wall 120 to a bottom surface of each of the first sidewall 105, the second sidewall 110, the proximal wall 115 and the distal wall 120. In another example, the opening 160 may extend from the top surface of each of the first sidewall 105, the second sidewall 110, the proximal wall 115 and the distal wall 120 to a floor or base that extends from the bottom surface of each of the first sidewall 105, the second sidewall 110, the proximal wall 115 and the distal wall 120.

In an example, the bracket 100 is slideably coupleable to a substrate. Accordingly, a first flange 125 and a second flange 130 may extend from an outer surface of the proximal wall 115. In an example, the first flange 125 and the second flange 130 form a first channel 135. The first channel 135 may extend along the length of the proximal wall 115 and have a width of approximately 1.45 mm. Although the width of the first channel 135 is specifically mentioned, the width of the first channel 135 may change based, at least in part, on a width of the substrate or PCB to which the bracket 100 is (or will be) slideably coupled. In another example, the first channel 135 may partially extend along the length of the proximal wall 115.

In an example the first flange 125 extends from a middle portion of the proximal wall 115 and the second flange 130 extends from a top surface of the proximal wall 115. However, in other examples, the first flange 125 and the second flange 130 may extend from any portion of the proximal wall 115, and in any direction along the proximal wall 115, so long as they define the first channel 135.

The bracket 100 may also include a second channel 150 provided on an outer surface of the proximal wall 120. The second channel 150 may extend across the length of the proximal wall 115. In another example, the second channel 150 may partially extend across the length of the proximal wall 120. In an example, the second channel 150 is defined by a third flange 140 and a fourth flange 145. For example, the third flange 140 and the fourth flange 145 extend from a middle portion of the distal wall 120 and a top surface of the distal wall 120, respectively. However, in other examples, the third flange 140 and the fourth flange 145 may extend from any portion of the distal wall 120 and/or in any direction, so long as they define the second channel 150.

The bracket 100 also includes a fastener 155. In an example, the first channel 135 includes a fastener 155 and the second channel 150 includes a fastener 155. The fastener 155 may be a snap fit fastener that includes a cantilever beam and a protrusion extending from a distal end of the cantilever beam.

In an example, the protrusion is tapered or shaped such that the fastener 155 moves from a first position to a second position when the bracket 100 is slideably coupled to the substrate. Once the bracket 100 has been coupled to the substrate and positioned within the opening of the substrate, the fastener 155 moves from the second position toward the first position. Additionally, the protrusion (or a portion of the protrusion) of the fastener 155 may be received into a notch positioned within the opening of substrate which secures the bracket 100 to the substrate.

In an example, the bracket 100 may also include an aperture 175 defined by the distal wall 120. The aperture 175 enables one or more leads of the capacitor to extend therethrough. As such, leads of the capacitor may be coupled to one or more pads of the substrate.

The bracket 100 may also includes one or more ledges 165. In an example, the one or more ledges 135 are provided on an inner surface of the first sidewall 105 and/or an inner surface of the second sidewall 110. For example, one or more ledges 165 may extend from an inner bottom surface of the first sidewall 105. Additionally, one or more ledges 165 may extend from an inner bottom surface of the second sidewall 110. Each of the one or more ledges 165 may be shaped to support the electrolytic capacitor that is received in the opening 160.

For example, the ledges 165 may be rounded or otherwise have a shape/contour that matches the shape/contour of the electrolytic capacitor. Although three ledges 165 are shown extending from the inner surface of the second sidewall 110, any number of ledges may extend from the inner surface of the first sidewall 105 and/or the inner surface of the second sidewall 110.

The bracket 100 may also include one or more ridges 170 that extend from a top surface of each sidewall. For example, a first ridge 170 may extend from the top surface of the first sidewall 105 and a second ridge 170 may extend from the top surface of the second sidewall 115. Each ridge 170 may be rounded or otherwise have a shape/contour that matches the shape/contour of the capacitor.

In an example, each ridge 170 may be flexible or made from a flexible material that enables the ridge 170 to move from a first position to a second position (e.g., a position that expands an opening or a distance between opposing ridges 170). When the ridges 170 are in the second position, the capacitor may be placed within the opening 160. Once the capacitor has been placed within the opening 160, each ridge 170 may move from the second position toward the first position to secure the capacitor within the opening 160.

Figure 2:
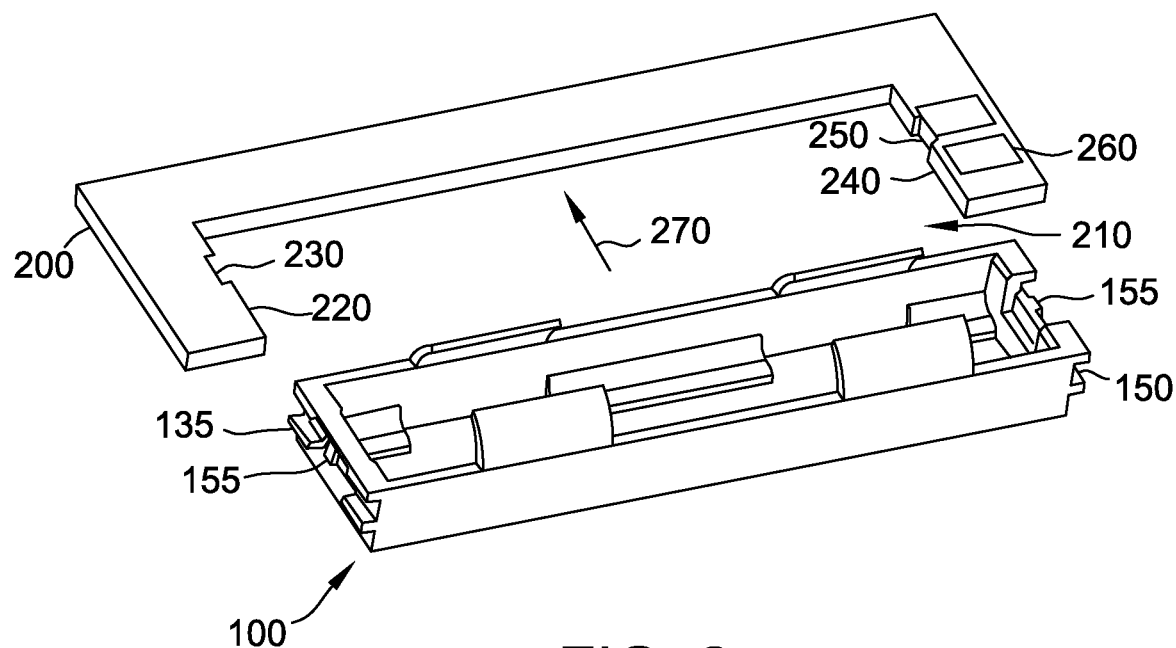
FIG. 2 illustrates the bracket of FIG. 1 being slideably coupled to a substrate according to an example.

FIG. 2 illustrates the bracket 100 of FIG. 1 being slideably coupled to a substrate 200 according to an example. In an example, the substrate 200 defines an opening 210. The opening 210 may have a size and/or a shape that is similar to, or otherwise conforms with, the shape of the bracket 100. As shown in FIG. 2, the bracket 100 is positioned horizontally with respect to the substrate 200 and/or the opening 210.

In an example, the substrate 200 has multiple inner edges within the opening 210. For example, the substrate 200 may have a proximal inner edge 220 and a distal inner edge 240. The proximal inner edge 220 defines a first notch 230 and the distal inner edge 240 defines a second notch 250. In an example, the first channel 135 of the bracket 100 is configured to slideably mate with the proximal inner edge 220 of the substrate 200. Likewise, the second channel 150 of the bracket 100 is configured to slideably mate with the distal inner edge 240 of the substrate 200.

When the first channel 135 and the second channel 150 have mated with the proximal inner edge 220 of the substrate 200 and the distal inner edge 240 of the substrate 200, the bracket 100 may slide (e.g., horizontally or laterally) within the opening 210 in the direction of the arrow 270. In an example, when the protrusions of each fastener 155 contact each edge of the substrate 200, the sliding motion, in addition to the shape of each protrusion of each fastener 155, causes each fastener 155 to move from a first position to a second position. Once each protrusion of each fastener 155 have reached the first notch 230 and the second notch 250 respectively, each fastener 155 moves from the second position back to the first position which causes the protrusion of each fastener 155 to be received into the first notch 230 and the second notch 250 respectively. As such, the bracket 100 is secured within the opening 210.

The substrate 200 may also include one or more pads 260 coupled to a surface of the substrate 200. The pads 260 may be positioned at or near a distal side of the opening 210. As will be shown and described in greater detail herein with respect to FIG. 4A and FIG. 4B, one or more leads of the capacitor may be electrically and/or communicatively coupled to the pads 260.

In an example, the bracket 100 may be removed from the opening 210 in a similar manner in which the bracket 100 was positioned within the opening 210. For example, each fastener 155 may be moved from the first position toward the second position, thereby freeing each protrusion from the first notch 230 and the second notch 250 respectively. The bracket 100 may then slide out of the opening 210.

Figure 3A:
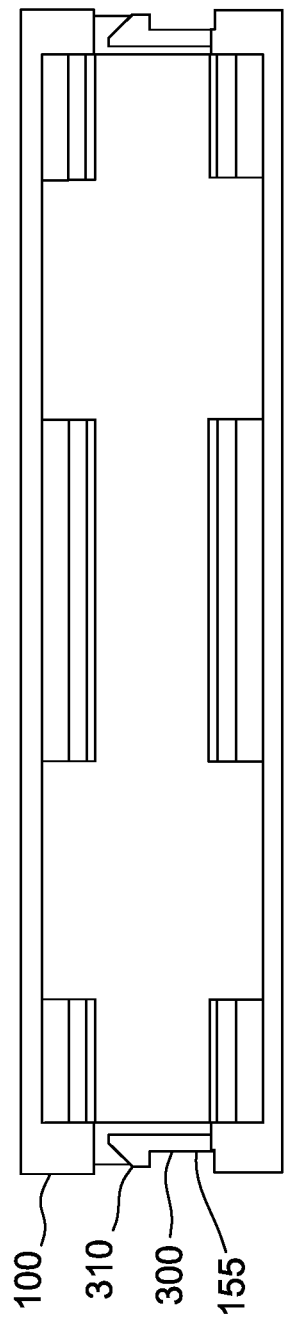
FIG. 3A illustrates the fasteners of the bracket of FIG. 1 being in a first position according to an example.
Figure 3B:
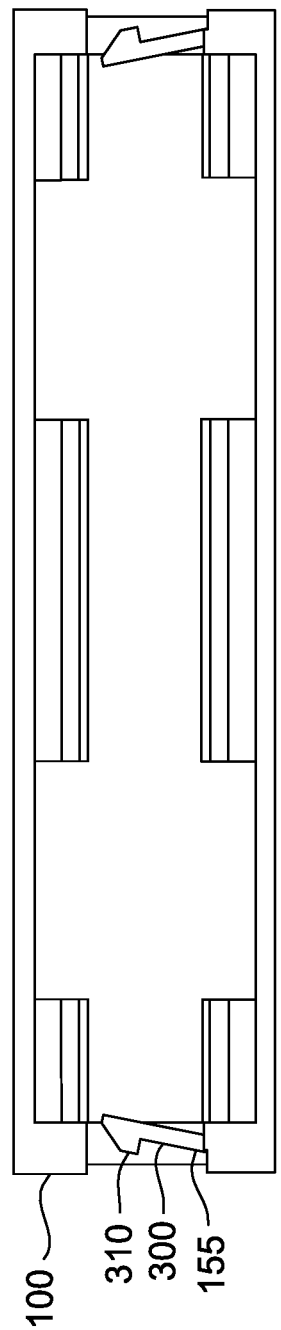
FIG. 3B illustrates the fasteners of the bracket of FIG. 1 being in a second position according to an example.

FIG. 3A illustrates the fasteners 155 of the bracket 100 of FIG. 1 being in a first position according to an example and FIG. 3B illustrates the fasteners 155 of the bracket 100 of FIG. 1 being in a second position according to an example. As previously explained, the fasteners 155 of the bracket 100 may be moved from the first position to the second position in response to the bracket 100 being slideably coupled to a substrate (e.g., the substrate 200 (FIG. 2)).

In an example, each fastener 155 (or the bracket 100 itself) is comprised a plastic, a metal or other flexible/bendable material that enables each fastener 155 to move from the first position (shown in FIG. 3A) to the second position (shown in FIG. 3B) and back to the first position. For example, each fastener 155 includes a cantilever beam 300. A proximal end of the cantilever beam 300 may be coupled to, or extend from, the bracket 100. A protrusion 310 is positioned at or otherwise extends from a distal end of the cantilever beam 300.

In an example, the protrusion 310 has a tapered or triangular shape that causes the cantilever beam 300 to move from the first position to the second position when the protrusion 310 contacts an edge of the substrate. For example, as the bracket 100 is slideably coupled to the substrate, an edge of the substrate contacts the protrusion 310. As the bracket 100 continues to slide within the opening, the edge of the substrate pushes on the protrusion 310 which causes the cantilever beam 300 to bend or move toward the second position. When the protrusion 310 reaches a notch (e.g., the first notch 230 (FIG. 2)) in the substrate, a portion of the protrusion 310 is received in the notch as the cantilever beam 300 moves from the second position back toward the first position. When the protrusion 310 is received into the notch, the bracket 100 is secured within the opening of the substrate.

Figure 4A:
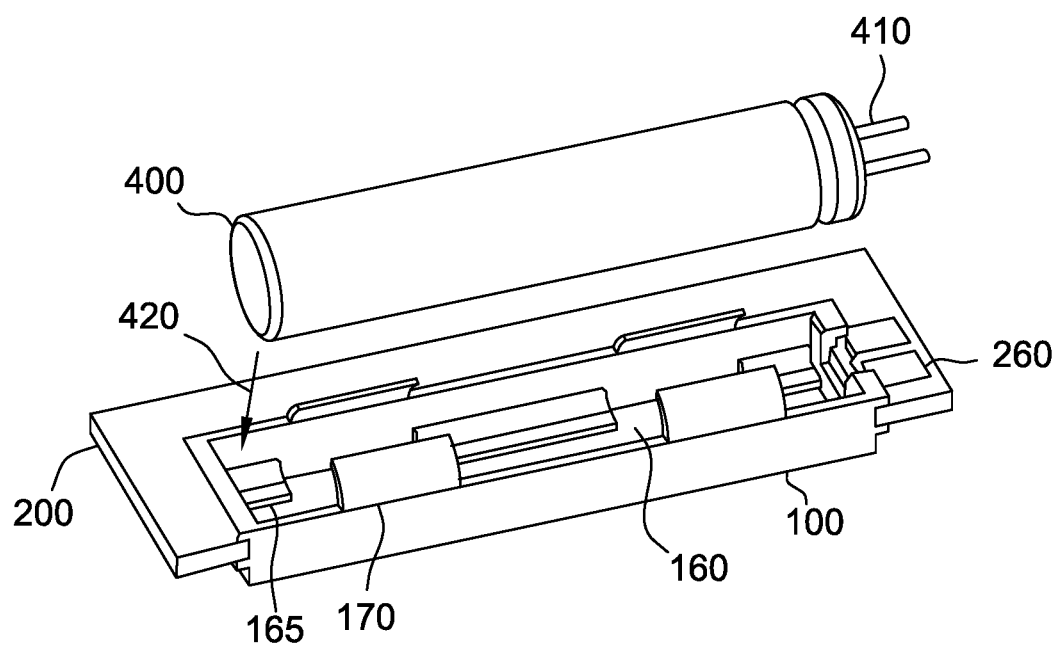
FIG. 4A illustrates a capacitor being placed into an opening of the bracket of FIG. 1 according to an example.

FIG. 4A illustrates a capacitor 400 being placed into an opening 160 of the bracket 100 of FIG. 1 according to an example. The capacitor 400 may be an electrolytic capacitor. However, it is contemplated that other capacitors may be placed within the opening 160 defined by the bracket 100. As such, the bracket 100 may have any number of different dimensions based, at least in part, on a type of capacitor that will be placed in the bracket 100.

In an example, the capacitor 400 includes one or more leads 410. The leads 410 may extend from a distal end of the capacitor 400 and may be electrically coupled to the pads 260 using a soldering process (e.g., a hot bar soldering process) when the capacitor 410 is placed within the opening 160.

The capacitor 400 may move toward the bracket 100 in the direction of the arrow 420 such that the capacitor 400 is positioned horizontally within the bracket 100 and horizontally with respect to the substrate 200. When the capacitor 400 contacts one or more ridges 170 of the bracket 100, the one or more ridges 170 may expand and/or move backward (e.g., away from ridges 170 on an opposite side of the opening 160) to allow the capacitor 400 to be received within the opening 160. Once the capacitor 400 is received within the opening 160, the capacitor 400 may rest or otherwise contact one or more ledges 165 positioned within the opening 160. Once the capacitor 400 has been received within the opening 160, the one or more ridges 170 may contract to secure the capacitor 400 within the opening 160.

While FIG. 4A illustrates the capacitor 400 being positioned within the bracket 100 after the bracket 100 has been slideably coupled to the substrate 200, it is contemplated that the capacitor 400 may be placed within the opening 160 of the bracket 100 prior to the bracket 100 being slideably coupled to the substrate 200. Once the capacitor 400 is placed within the opening 160 of the bracket 100, the bracket 100 may be slideably coupled to the substrate 200.

Figure 4B:
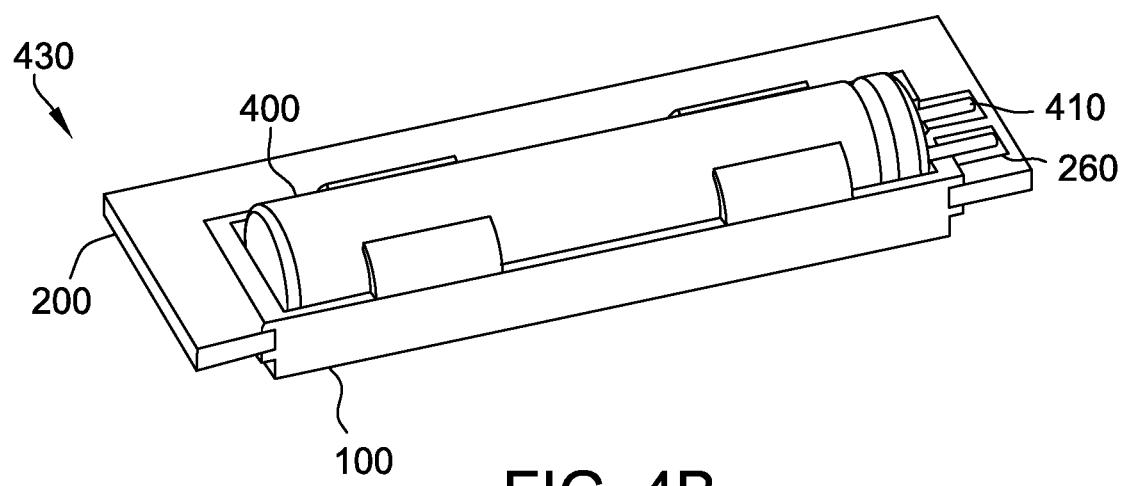
FIG. 4B illustrates a semiconductor package that includes the capacitor of FIG. 4A, the bracket of FIG. 1 and the substrate of FIG. 2 according to an example.

FIG. 4B illustrates a semiconductor package 430 that includes the capacitor 400 of FIG. 4A, the bracket 100 of FIG. 1 and the substrate 200 of FIG. 2 according to an example. In this example, when the capacitor 400 is horizontally mounted to or otherwise positioned in the bracket 100, the one or more leads 410 of the capacitor 400 extend through an aperture (e.g., aperture 175 (FIG. 1)) provided on a distal wall (e.g., distal wall 120 (FIG. 1)) of the bracket 100. The one or more leads 410 are then coupled to the one or more pads 260 of the substrate 200. In an example, the one or more leads 410 of the capacitor are coupled to the substrate 200 using a hot bar soldering process or another soldering process.

Accordingly, examples of the present disclosure describe a bracket for mounting a capacitor to a substrate, comprising: a first sidewall; a second sidewall opposite the first sidewall; a proximal wall extending between a proximal end of the first sidewall and a proximal end of the second sidewall; a distal wall extending between a distal end of the first sidewall and a distal end of the second sidewall, the first sidewall, the second sidewall, the proximal wall and the distal wall defining an opening; a first flange and a second flange extending from the proximal wall and forming a first channel that receives a first edge of a substrate; a third flange and a fourth flange extending from the distal wall and forming a second channel that receives a second edge of the substrate; a first fastener disposed within the first channel; and a second fastener disposed within the second channel. In an example, the first fastener comprises: a cantilever beam; and a protrusion extending from a distal end of the cantilever beam. In an example, the protrusion causes the cantilever beam to move from a first position to a second position when the first channel receives the first edge of the substrate. In an example, the protrusion is received by a notch defined by the first edge of the substrate. In an example, the bracket also includes an aperture defined by the distal wall, the aperture receiving a lead of the capacitor when the capacitor is placed in the opening. In an example, the bracket also includes a first ledge provided on an inner portion of the first sidewall and a second ledge provided on an inner portion of the second sidewall, each of the first ledge and the second ledge supporting the capacitor when the capacitor is received in the opening. In an example, the bracket also includes a first ridge extending from a top surface of the first sidewall and a second ridge extending from a top surface of the second sidewall. In an example, the first ridge and the second ridge are rounded.

Additional examples describe a semiconductor package, comprising: a substrate defining an opening; a notch disposed on a first edge of the substrate within the opening; a bracket for a capacitor provided within the opening, the bracket comprising: a first sidewall; a second sidewall; a proximal wall extending between a proximal end of the first sidewall and a proximal end of the second sidewall; a distal wall extending between a distal end of the first sidewall and a distal end of the second sidewall, the first sidewall, the second sidewall, the proximal wall and the distal wall defining a bracket opening; a first flange and a second flange extending from the proximal wall and forming a first channel that is slideably coupled to the first edge of the substrate; a third flange and a fourth flange extending from the distal wall and forming a second channel that is slideably coupled to a second edge of the substrate; and a snap fit fastener disposed within the first channel such that a portion of the snap fit fastener is received by the notch. In an example, the semiconductor package also includes an electrolytic capacitor horizontally positioned within the bracket opening. In an example, the semiconductor package also includes an aperture defined by the distal wall, the aperture receiving a lead of the electrolytic capacitor when the electrolytic capacitor is positioned within the bracket opening. In an example, the semiconductor package also includes a first ledge provided on an inner portion of the first sidewall and a second ledge provided on an inner portion of the second sidewall, each of the first ledge and the second ledge supporting the electrolytic capacitor when the electrolytic capacitor is horizontally positioned within the bracket opening. In an example, the semiconductor package also includes an aperture defined by the distal wall, the aperture receiving a lead of the electrolytic capacitor when the electrolytic capacitor is horizontally positioned within the bracket opening. In an example, the snap fit fastener comprises a cantilever beam and the portion of the snap fit fastener is a tapered protrusion that extends from a distal end of the cantilever beam. In an example, the tapered protrusion causes the cantilever beam to move from a first position to a second position as the bracket is slideably coupled to the substrate. In an example, the semiconductor package also includes a first ridge extending from a top surface of the first sidewall and a second ridge extending from a top surface of the second sidewall. In an example, the semiconductor package also includes one or more pads provided on a surface of the substrate proximate to the opening.

Examples also describe a bracket for mounting a capacitor to a substrate, comprising: a body defining an opening; a first coupling means provided on a proximal end of the body; a second coupling means provided on a distal end of the body, the first coupling means and the second coupling means for slideably coupling the bracket to an opening defined by a substrate; and a fastening means for securing the bracket within the opening defined by the substrate. In an example, the fastening means comprises a cantilever beam having a tapered protrusion at a distal end. In an example, the bracket also includes a support means provided within the opening, the support means for supporting an electrolytic capacitor when the electrolytic capacitor is horizontally positioned within the opening of the body.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A bracket for mounting a capacitor to a substrate, comprising:
a first sidewall;
a second sidewall opposite the first sidewall;
a proximal wall extending between a proximal end of the first sidewall and a proximal end of the second sidewall;
a distal wall extending between a distal end of the first sidewall and a distal end of the second sidewall, the first sidewall, the second sidewall, the proximal wall and the distal wall defining an opening;
a first flange and a second flange extending from the proximal wall and forming a first channel that receives a first edge of a substrate;
a third flange and a fourth flange extending from the distal wall and forming a second channel that receives a second edge of the substrate;
a first fastener disposed within the first channel, the first fastener comprising:
a cantilever beam; and
a protrusion extending from a distal end of the cantilever beam, the protrusion causing the cantilever beam to move from a first position to a second position when the first channel receives the first edge of the substrate; and
a second fastener disposed within the second channel.

2. The bracket of claim 1, wherein the protrusion is received by a notch defined by the first edge of the substrate when the cantilever beam moves from the second position back to the first position.

3. The bracket of claim 1, further comprising an aperture defined by the distal wall, the aperture receiving a lead of the capacitor when the capacitor is placed in the opening.

4. The bracket of claim 1, further comprising a first ledge provided on an inner portion of the first sidewall and a second ledge provided on an inner portion of the second sidewall, each of the first ledge and the second ledge supporting the capacitor when the capacitor is received in the opening.

5. The bracket of claim 1, further comprising a first ridge extending from a top surface of the first sidewall and a second ridge extending from a top surface of the second sidewall.

6. The bracket of claim 5, wherein the first ridge and the second ridge are rounded.

7. A semiconductor package, comprising:
a substrate defining an opening;
a notch disposed on a first edge of the substrate within the opening;
a bracket for a capacitor provided within the opening, the bracket comprising:

a first sidewall;

a second sidewall;

a proximal wall extending between a proximal end of the first sidewall and a proximal end of the second sidewall;

a distal wall extending between a distal end of the first sidewall and a distal end of the second sidewall, the first sidewall, the second sidewall, the proximal wall and the distal wall defining a bracket opening;

a first flange and a second flange extending from the proximal wall and forming a first channel that is slideably coupled to the first edge of the substrate;

a third flange and a fourth flange extending from the distal wall and forming a second channel that is slideably coupled to a second edge of the substrate; and a snap fit fastener disposed within the first channel, the snap fit fastener comprising a cantilever beam having a protrusion extending from a distal end, the protrusion causing the cantilever beam to move from a first position to a second position as the bracket is slideably coupled to the substrate.

8. The semiconductor package of claim 7, further comprising an electrolytic capacitor horizontally positioned within the bracket opening.

9. The semiconductor package of claim 8, further comprising an aperture defined by the distal wall, the aperture receiving a lead of the electrolytic capacitor when the electrolytic capacitor is horizontally positioned within the bracket opening.

10. The semiconductor package of claim 8, further comprising a first ledge provided on an inner portion of the first sidewall and a second ledge provided on an inner portion of the second sidewall, each of the first ledge and the second ledge supporting the electrolytic capacitor when the electrolytic capacitor is horizontally positioned within the bracket opening.

11. The semiconductor package of claim 8, further comprising an aperture defined by the distal wall, the aperture receiving a lead of the electrolytic capacitor when the electrolytic capacitor is horizontally positioned within the bracket opening.

12. The semiconductor package of claim 7, wherein the protrusion that extends from a distal end of the cantilever beam is received by the notch when the cantilever beam moves from the second position back to the first position.

13. The semiconductor package of claim 7, further comprising a first ridge extending from a top surface of the first sidewall and a second ridge extending from a top surface of the second sidewall.

14. The semiconductor package of claim 7, further comprising one or more pads provided on a surface of the substrate proximate to the opening.

15. A bracket for mounting a capacitor to a substrate, comprising:

a body defining an opening;

a first coupling means provided on a proximal end of the body;

a second coupling means provided on a distal end of the body, the first coupling means and the second coupling means for coupling the bracket to an opening defined by a substrate; and a fastening means for securing the bracket within the opening defined by the substrate, the fastening means comprising a cantilever beam having a protrusion extending from a distal end, the protrusion causing the cantilever beam to move from a first position to a second position as the bracket is coupled to the opening defined by the substrate.

16. The bracket of claim 15, further comprising a support means provided within the opening, the support means for supporting an electronic component when the electronic component is positioned within the opening of the body.

17. The bracket of claim 15, wherein the protrusion is tapered.

18. The bracket of claim 15, wherein the protrusion is received by a notch when the cantilever beam moves from the second position back to the first position.

19. The bracket of claim 15, further comprising an aperture defined by the body, the aperture receiving a lead of an electronic component when the electronic component is placed in the opening.

20. The bracket of claim 15, wherein the first coupling means defines a channel that receives at least a portion of the substrate.

* * * * *